(12) United States Patent
Chu et al.

(10) Patent No.: US 8,482,066 B2
(45) Date of Patent: Jul. 9, 2013

(54) SEMICONDUCTOR DEVICE

(75) Inventors: Chien-Wen Chu, Yangmei Township, Taoyuan County (TW); Wing-Chor Chan, Hsinchu (TW); Shyi-Yuan Wu, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/225,189

(22) Filed: Sep. 2, 2011

(65) Prior Publication Data

US 2013/0056824 A1 Mar. 7, 2013

(51) Int. Cl.
*H01L 31/119* (2006.01)

(52) U.S. Cl.
USPC ............ 257/343; 257/342; 257/490

(58) Field of Classification Search
USPC ................................ 257/343, 344
See application file for complete search history.

(56) References Cited

U.S. PATENT DOCUMENTS

| | | | |
|---|---|---|---|
| 6,111,289 A | 8/2000 | Udrea | |
| 7,180,132 B2 | 2/2007 | Cai et al. | |
| 7,632,760 B2 | 12/2009 | Tu et al. | |
| 7,999,317 B2 * | 8/2011 | Lu et al. | 257/342 |
| 2002/0098637 A1 | 7/2002 | Hossain et al. | |
| 2006/0067137 A1 | 3/2006 | Udrea et al. | |
| 2008/0290410 A1 * | 11/2008 | Huang et al. | 257/343 |
| 2009/0072340 A1 * | 3/2009 | Zhang et al. | 257/490 |
| 2010/0140703 A1 * | 6/2010 | Ko | 257/343 |
| 2010/0301413 A1 * | 12/2010 | You | 257/343 |

* cited by examiner

*Primary Examiner* — Dung A. Le
(74) *Attorney, Agent, or Firm* — McClure, Qualey & Rodack, LLP

(57) ABSTRACT

A semiconductor device and a manufacturing method for the same are provided. The semiconductor device comprises a first doped region, a second doped region, a dielectric structure and a gate structure. The first doped region has a first type conductivity. The second doped region has a second type conductivity opposite to the first type conductivity and is adjacent to the first doped region. The dielectric structure comprises a first dielectric portion and a second dielectric portion separated from each other. The dielectric structure is formed on the first doped region. The gate structure is on a part of the first doped region or second doped region adjacent to the first dielectric portion.

18 Claims, 5 Drawing Sheets

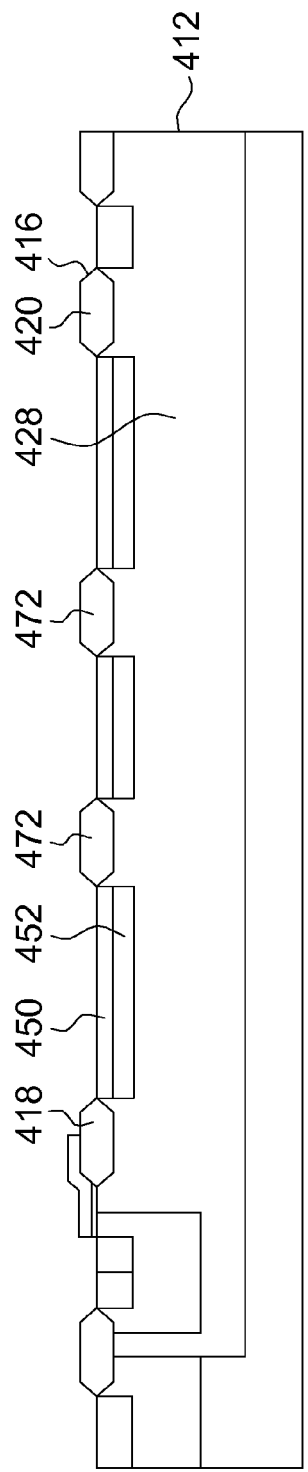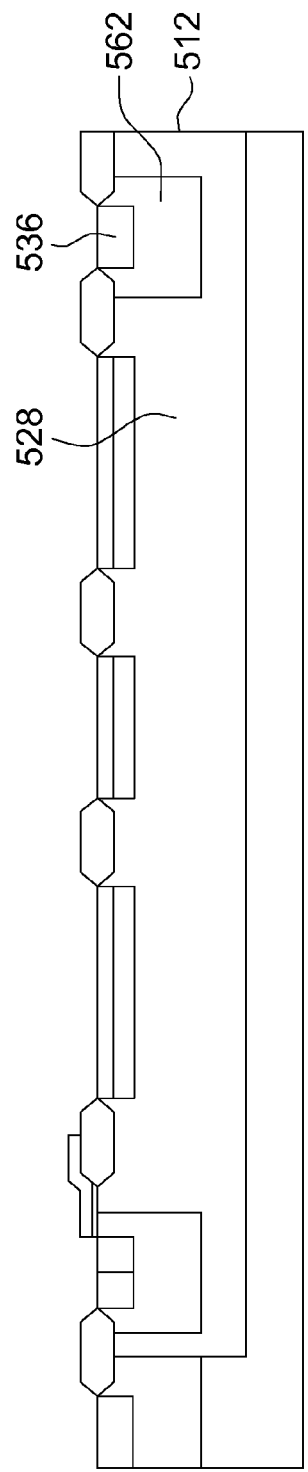

SEMICONDUCTOR DEVICE

BACKGROUND

1. Technical Field

The disclosure relates in general to a semiconductor device and a manufacturing method for the same, and more particularly to a MOS, a transistor and a manufacturing method for the same.

2. Description of the Related Art

In a semiconductor technique, for example, a semiconductor device such as power device uses LDMOS. A method for increasing a breakdown voltage (BVdss) of the semiconductor device is decreasing a dopant concentration of a drain region and increasing a drift length. However, an on-state resistance of the semiconductor structure is increased due to the method. In addition, a big design area is need.

In the semiconductor technique, an insulated gate bipolar transistor (IGBT) has both advantages of a MOS and a bipolar junction transistor (BJT). The IGBT can be applied for a switching application.

SUMMARY

A semiconductor device is provided. The semiconductor device comprises a first doped region, a second doped region, a dielectric structure and a gate structure. The first doped region has a first type conductivity. The second doped region has a second type conductivity opposite to the first type conductivity and is adjacent to the first doped region. The dielectric structure comprises a first dielectric portion and a second dielectric portion separated from each other. The dielectric structure is formed on the first doped region. The gate structure is on a part of the first doped region or second doped region adjacent to the first dielectric portion.

A method for manufacturing a semiconductor device is provided. The method comprises following steps. A second doped region having a second type conductivity is formed in a first doped region having a first type conductivity opposite to the second type conductivity. A dielectric structure is formed on the first doped region. The dielectric structure comprises a first dielectric portion and a second dielectric portion separated from each other. A gate structure is formed on a part of the first doped region or the second doped region adjacent to the first dielectric portion.

BRIEF DESCRIPTION OF THE DRAWINGS

FIG. 5 illustrates a cross-section view of a semiconductor device in one embodiment.

FIG. 6 illustrates a cross-section view of a semiconductor device in one embodiment.

DETAILED DESCRIPTION

Figure 1:
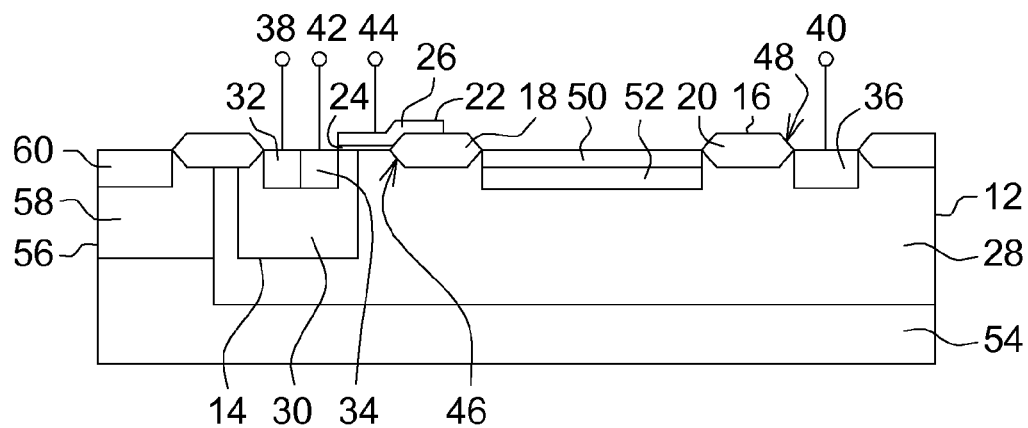
FIG. 1 illustrates a cross-section view of a semiconductor device in one embodiment.

FIG. 1 illustrates a cross-section view of a semiconductor device in one embodiment. Referring to FIG. 1, a first doped region 12 is adjacent to a second doped region 14. The first doped region 12 comprises a doped portion 28 having a first type conductivity such as N type conductivity. The second doped region 14 may comprise a doped portion 30 and a doped portion 32 having a second type conductivity opposite to the first type conductivity, such as P type conductivity. In embodiments, the doped portion 30 is formed by doping the first doped region 12 with using a patterned mask layer. The doped portion 32 is formed by doping the doped portion 30 with using a patterned mask layer (not shown). The doped portion 32 may be a heavily doped region.

In one embodiment, the third doped region 34 having the first type conductivity such as N type conductivity is formed by doping the doped portion 30 with using a patterned mask layer (not shown). The fourth doped region 36 is formed by doping the first doped region 12 with using a patterned mask layer (not shown). The third doped region 34 and the fourth doped region 36 may be heavily doped regions.

Referring to FIG. 1, a dielectric structure 16 is formed on the first doped region 12. The dielectric structure 16 comprises a first dielectric portion 18 and a second dielectric portion 20 separated from each other. The first dielectric portion 18 and the second dielectric portion 20 are not limited to FOX as shown in FIG. 1, and may comprise STI or other suitable insulators.

A gate structure 22 is formed on a part of the first doped region 12 or the second doped region 14 adjacent to the first dielectric portion 18. The gate structure 22 may comprise a dielectric layer 24 formed on the first doped region 12 or the second doped region 14 and an electrode layer 26 formed on the dielectric layer 24. The electrode layer 26 may comprise a metal, a polysilicon or a silicide.

Referring to FIG. 1, a fourth doped region 36 and the second doped region 14 are respectively on opposite side walls 46, 48 of the dielectric structure 16. In one embodiment, a first doped layer 50 is formed on the doped portion 28 between the first dielectric portion 18 and the second dielectric portion 20. The first doped layer 50 has the second type conductivity such as P type conductivity. The first doped region 12 may comprise a second doped layer 52 having the first type conductivity such as N type conductivity and under the first doped layer 50. The second doped layer 52 may be formed by doping the doped portion 28 with using a patterned mask layer (not shown). The first doped layer 50 may be formed by doping the second doped layer 52 with using a patterned mask layer (not shown).

Referring to FIG. 1, a bottom layer 54 may be under the first doped region 12. The bottom layer 54 may have the second type conductivity such as P type conductivity. The bottom layer 54 may be a substrate or an epitaxial layer. In one embodiment, the bottom layer 54 is a silicon on insulator (SOI). The doped portion 28 of the first doped region 12 is formed by doping the bottom layer 54 with using a patterned mask layer (not shown). The doped portion 28 may be formed on the bottom layer 54 by an epitaxial method. A doped well region 56 is adjacent to the doped portion 28 and on the bottom layer 54. The doped well region 56 comprises a doped portion 58 and a doped portion 60 having the second type conductivity such as P type conductivity. The doped portion 58 is formed by doping the bottom layer 54 with using a patterned mask layer (not shown). The doped portion 58 may be formed on the bottom layer 54 by an epitaxial method. The doped portion 60 may be formed by doping the doped portion 58 with using a patterned mask layer (not shown). The doped portion 60 may be a heavily doped region.

In one embodiment, the semiconductor device is a MOS such as lateral double diffusion MOS (LDMOS). In this case, the first doped region 12 comprises the fourth doped region 36 having the first type conductivity such as N type conductivity. The gate structure 22 is on the doped portion 30 between the doped portion 28 and the third doped region 34. An electrode 40 such as a drain electrode is electrically connected the fourth doped region 36. An electrode 42 such as a source electrode is electrically connected to the third doped region 34. An electrode 44 such as a gate electrode is electrically connected to the gate structure 22. An electrode 38 such as a base electrode is electrically connected to the doped portion 32. The electrode 38 and the electrode 42 may be electrically connected to each other.

In another embodiment, the semiconductor device is an insulated gate bipolar transistor (IGBT), particularly an lateral insulated gate bipolar transistor (LIGBT). In this case, the fourth doped region 36 has the second type conductivity such as P type conductivity. The gate structure 22 is on the doped portion 28 between the first dielectric portion 18 and the doped portion 30. The electrode 40 such as a collector electrode is electrically connected to the fourth doped region 36. The electrode 38 such as an emitter electrode is electrically connected to the doped portion 32. The electrode 44 such as a gate electrode is electrically connected to the gate structure 22. The electrode 42 such as a base electrode is electrically connected to the third doped region 34. The electrode 38 and the electrode 42 may be electrically connected to each other.

The semiconductor device may be easily adjusted to be a (800V) LDMOS by forming the fourth doped region 36 having the first type conductivity such as N type conductivity or to be a (700V) IGBT by forming the fourth doped region 36 having the second type conductivity such as P type conductivity. The semiconductor device can be manufactured by a CMOS process such as a 700V power CMOS process. Therefore, an additional mask or process is not need. In addition, the semiconductor device can be incorporated into one chip with other devices. In embodiments, the dielectric structure 16 and reduced surface field (RESURF), particularly double RESURF, concept of the first doped layer 50 and the second doped layer 52 increase a drain breakdown voltage and decrease Rdson of the semiconductor device such as LDMOS. In one embodiment, the semiconductor device is a 700V or 820V LSMOS.

For example, as the first type conductivity is N type conductivity and the second type conductivity is P type conductivity, the semiconductor device is an N-channel LIGBT or a LDNMOS. On the contrary, as the first type conductivity is P type conductivity and the second type conductivity is N type conductivity, the semiconductor device is a P-channel LIGBT or a LDPMOS.

Figure 2:
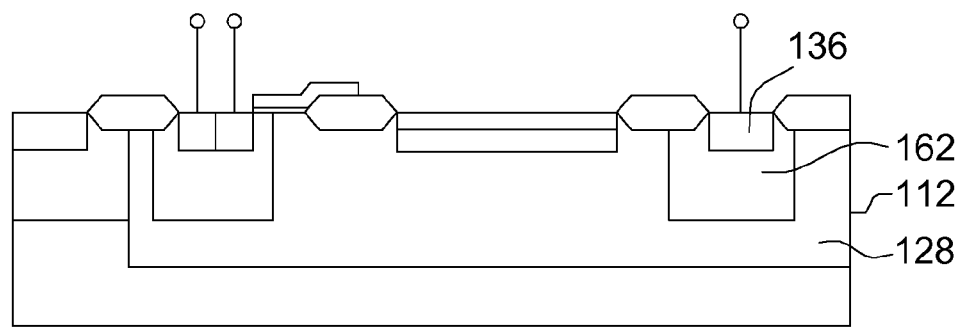
FIG. 2 illustrates a cross-section view of a semiconductor device in one embodiment.

FIG. 2 illustrates a cross-section view of a semiconductor device in one embodiment. The semiconductor device as shown in FIG. 2 differs from the semiconductor device as shown in FIG. 1 in that the first doped region 112 comprises a doped portion 162 having the first type conductivity such as N type conductivity. The doped portion 162 may be formed by doping the doped portion 128 with using a patterned mask layer (not shown). In the case, the fourth doped region 136 may be formed by doping the doped portion 162 with using a patterned mask layer (not shown).

Figure 3:
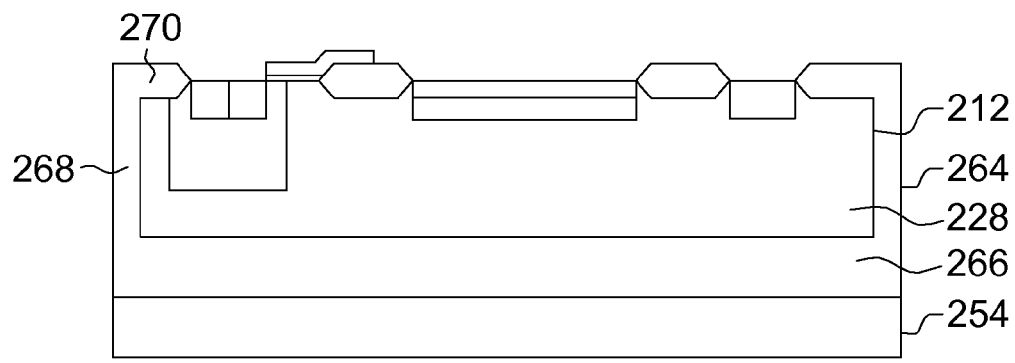
FIG. 3 illustrates a cross-section view of a semiconductor device in one embodiment.

FIG. 3 illustrates a cross-section view of a semiconductor device in one embodiment. The semiconductor device as shown in FIG. 3 differs from the semiconductor device as shown in FIG. 1 in that, the doped portion 228 of the first doped region 212 is surrounded by an isolation structure 264. The isolation structure 264 may comprise an isolation portion 266, an isolation portion 268 and an isolation portion 270. For example, the isolation portion 266 formed on the bottom layer 254 is a buried layer such as a dielectric oxide. The isolation portion 268 may be a deep trench comprising a dielectric oxide. The isolation portion 270 formed on the isolation portion 268 is not limited to an oxide, and may be a STI.

Figure 4:
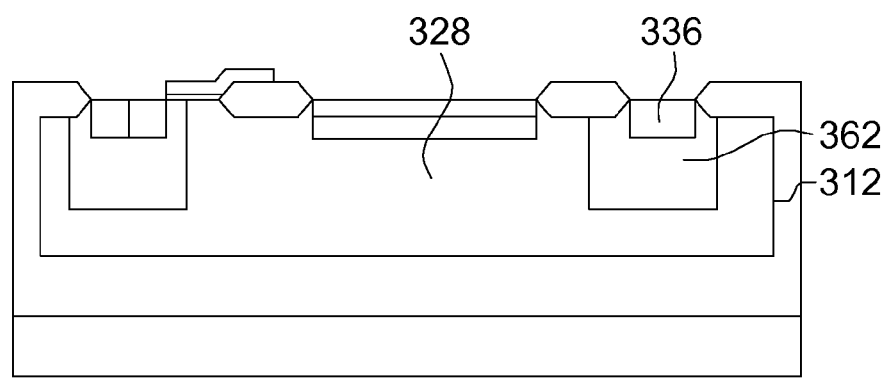
FIG. 4 illustrates a cross-section view of a semiconductor device in one embodiment.

FIG. 4 illustrates a cross-section view of a semiconductor device in one embodiment. The semiconductor device as shown in FIG. 4 differs from the semiconductor device as shown in FIG. 3 in that the first doped region 312 comprises a doped portion 362 having the first type conductivity such as N type conductivity. The doped portion 362 may be formed by doping the doped portion 328 with using a patterned mask layer (not shown). In the case, the fourth doped region 336 may be formed by doping the doped portion 362 with using a patterned mask layer (not shown).

FIG. 5 illustrates a cross-section view of a semiconductor device in one embodiment. The semiconductor device as shown in FIG. 5 differs from the semiconductor device as shown in FIG. 1 in that the dielectric structure 416 comprises at least one third dielectric portion 472 between the first dielectric portion 418 and the second dielectric portion 420. The second doped layer 452, having the first type conductivity such as N type conductivity, of the first doped region 412 is on the doped portion 428 between the first dielectric portion 418, the second dielectric portion 420 and the third dielectric portion 472. The first doped layer 450 having the second type conductivity such as P type conductivity is on the second doped layer 452.

FIG. 6 illustrates a cross-section view of a semiconductor device in one embodiment. The semiconductor device as shown in FIG. 6 differs from the semiconductor device as shown in FIG. 5 in that the first doped region 512 comprises a doped portion 562 having the first type conductivity such as N type conductivity. The doped portion 562 may be formed by doping the doped portion 528 with using a patterned mask layer (not shown). In the case, the fourth doped region 536 may be formed by doping the doped portion 562 with using a patterned mask layer (not shown).

Figure 7:
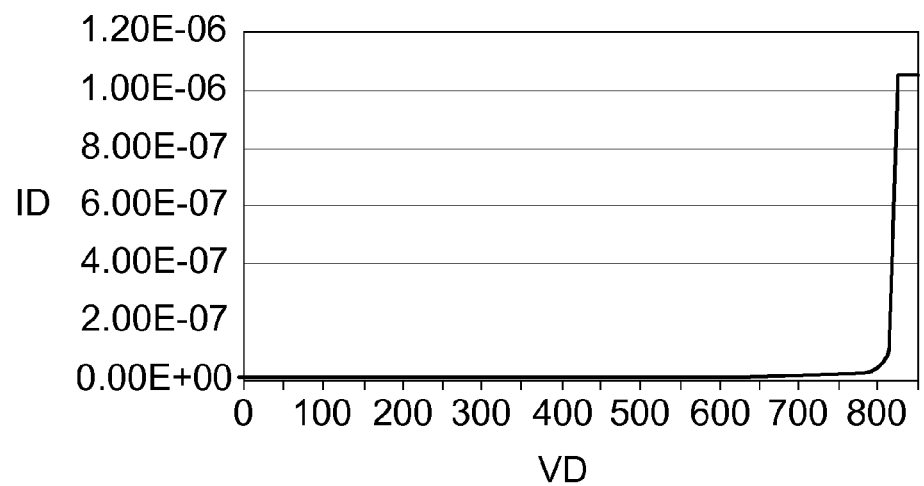
FIG. 7 shows an Off-By curve of the semiconductor device in one embodiment.
Figure 8:
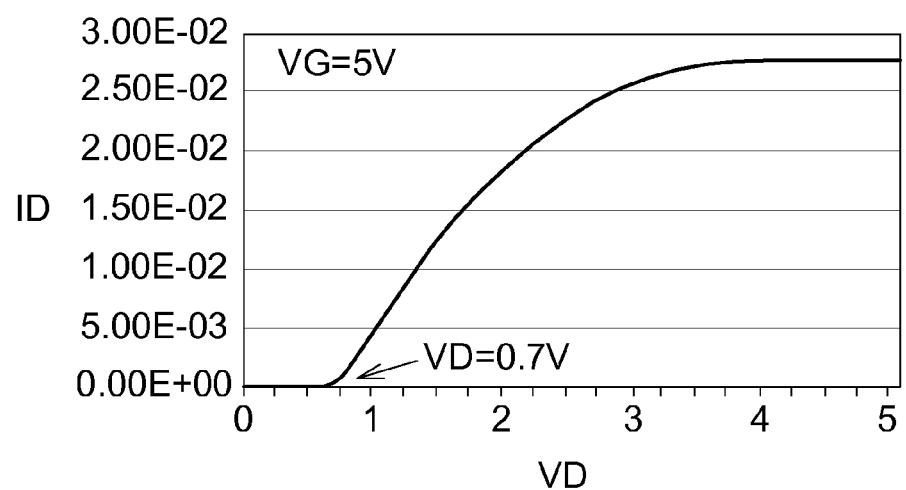
FIG. 8 shows an ID-VD curve of the semiconductor device in one embodiment.
Figure 9:
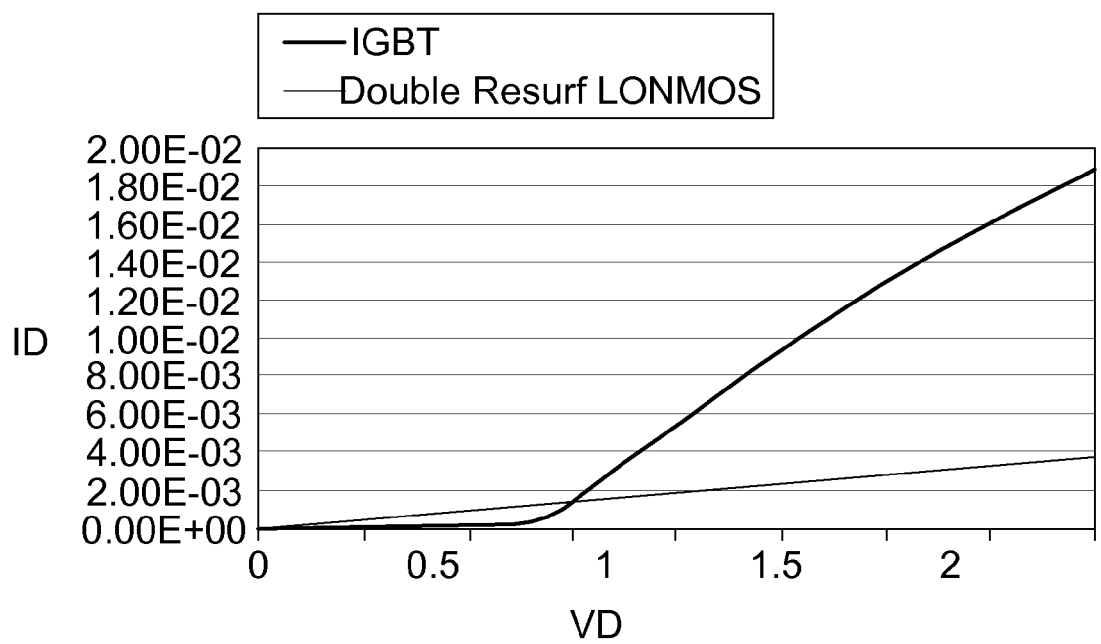
FIG. 9 shows id-lines of the semiconductor devices in embodiments.

FIG. 7 shows an Off-By curve of the semiconductor device as a LIGB in one embodiment. BV is 820V. FIG. 8 shows an ID-VD curve of the semiconductor device as a LIGBT in one embodiment. VG is 5V. FIG. 9 shows id-lines of the semiconductor device as a LIGBT and the semiconductor device as a double RESURF LDNMOS. VG of the LIGBT is 5V. VG of the LDNMOS is 10V.

According to embodiments of the present disclosure, the semiconductor device can be easily adjusted to a LDMOS or an IGBT by adjusting the conductivity type of the fourth doped region. In addition, the semiconductor device can be manufactured by a CMOS process. Therefore, semiconductor device can be incorporated with various devices. In addition, an additional cost is not need. An efficiency of the semiconductor device is increased by using the dielectric structure and RESURF concept of the first doped layer and the second doped layer.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a first doped region having a first type conductivity;
   a second doped region having a second type conductivity opposite to the first type conductivity and adjacent to the first doped region;
   a dielectric structure comprising a first dielectric portion and a second dielectric portion separated from each other, wherein the dielectric structure is formed on the first doped region;
   a gate structure on a part of the first doped region or second doped region adjacent to the first dielectric portion; and
   a first doped layer having the second type conductivity, the first doped layer being on the first doped region between the first dielectric portion and the second dielectric portion, the first doped region comprising a second doped layer having the first type conductivity and under the first doped layer.

2. The semiconductor device according to claim 1, wherein the first doped region comprises a heavily doped region, the heavily doped region and the second doped region are respectively on opposite side walls of the dielectric structure.

3. The semiconductor device according to claim 1, wherein the dielectric structure further comprises at least one third dielectric portion between the first dielectric portion and the second dielectric portion.

4. The semiconductor device according to claim 3, wherein the first doped layer is on the first doped region between the first dielectric portion, the second dielectric portion and the third dielectric portion.

5. The semiconductor device according to claim 1, further comprising an isolation structure adjacent to the first doped region.

6. The semiconductor device according to claim 5, wherein the first doped region is surrounded by the isolation structure.

7. The semiconductor device according to claim 1, further comprising a bottom layer having the second type conductivity and under the first doped region.

8. The semiconductor device according to claim 1, further comprising a doped well region having the second type conductivity, adjacent to the first doped region, and on the bottom layer.

9. The semiconductor device according to claim 1, further comprising a third doped region having the first type conductivity, wherein the gate structure is on the second doped region between the first doped region and the third doped region, a first electrode is electrically connected to the first doped region, a second electrode is electrically connected to the third doped region.

10. The semiconductor device according to claim 9, wherein the first electrode is a drain electrode, the second electrode is a source electrode.

11. The semiconductor device according to claim 9, wherein the semiconductor device is a LDMOS.

12. The semiconductor device according to claim 1, further comprising a fourth doped region having the second type conductivity, wherein the second doped region and the fourth doped region are respectively on opposite side walls of the dielectric structure.

13. The semiconductor device according to claim 12, wherein the first electrode is electrically connected to the second doped region, a second electrode is electrically connected to the fourth doped region.

14. The semiconductor device according to claim 13, wherein the first electrode is an emitter electrode, the second electrode is a collector electrode.

15. The semiconductor device according to claim 12, wherein the gate structure is on the first doped region between the dielectric structure and the second doped region.

16. The semiconductor device according to claim 12, wherein the semiconductor device is a LIGBT.

17. The semiconductor device according to claim 1, wherein the semiconductor device is a MOS or a IGBT.

18. A method for manufacturing a semiconductor device, comprising:
   forming a second doped region having a second type conductivity in a first doped region having a first type conductivity opposite to the second type conductivity;
   forming a dielectric structure on the first doped region, wherein the dielectric structure comprises a first dielectric portion and a second dielectric portion separated from each other;
   forming a gate structure on a part of the first doped region or the second doped region adjacent to the first dielectric portion; and
   forming a first doped layer having the second type conductivity and on the first doped region between the first dielectric portion and the second dielectric portion, the first doped region comprising a second doped layer having the first type conductivity and under the first doped layer.

* * * * *